United States Patent
Jang et al.

(10) Patent No.: US 10,359,676 B2
(45) Date of Patent: Jul. 23, 2019

(54) DISPLAY DEVICE INCLUDING A DATA LINE HAVING A DOUBLE LINE STRUCTURE

(71) Applicant: SAMSUNG DISPLAY CO., LTD., Yongin-si, Gyeonggi-do (KR)

(72) Inventors: Hwanyoung Jang, Daegu (KR); Kyunghoe Lee, Seoul (KR); Seongyoung Lee, Hwaseong-si (KR); Byoungsun Na, Seoul (KR); Seonkyoon Mok, Hwaseong-si (KR); Hyungjun Park, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/990,246

(22) Filed: May 25, 2018

(65) Prior Publication Data

US 2018/0275475 A1    Sep. 27, 2018

Related U.S. Application Data

(63) Continuation of application No. 15/472,796, filed on Mar. 29, 2017, now Pat. No. 9,995,982.

(30) Foreign Application Priority Data

Mar. 30, 2016    (KR) .................. 10-2016-0038496

(51) Int. Cl.
*H01L 29/786* (2006.01)
*G02F 1/1362* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
None
See application file for complete search history.

(56) References Cited

U.S. PATENT DOCUMENTS 7,528,412 B2    5/2009    Baek et al.
7,592,627 B2 *  9/2009    Tsai .................. H01L 27/1255
                                                       257/72
(Continued)

FOREIGN PATENT DOCUMENTS

KR    10-1999-0003276    1/1999
KR    10-2001-0057022    7/2001
KR    10-2011-0052986    5/2011

*Primary Examiner* — Chandra Chaudhari
(74) *Attorney, Agent, or Firm* — F. Chau & Associates, LLC (57) ABSTRACT

A display device including a substrate, a gate line, a data line, a plurality of thin film transistors, a first pixel electrode, and a second pixel electrode. The gate line is disposed on the substrate. The data line is disposed on the substrate. The data line includes a first branch line and a second branch line. The first branch line and the second branch line form a closed loop. The plurality of thin film transistors is connected to the data line. The first pixel electrode is connected to at least one of the plurality of thin film transistors. The second pixel electrode is connected to at least another one of the plurality of thin film transistors. The first pixel electrode and the second pixel electrode are arranged in a substantially diagonal direction with respect to each another. The first branch line is connected to a source electrode of said at least one of the plurality of thin film transistors. The second branch line is connected to a source electrode of said at least another one of the plurality of thin film transistors.

18 Claims, 4 Drawing Sheets

(51) Int. Cl.
*G02F 1/1368* (2006.01)
*G02F 1/1343* (2006.01)

(52) U.S. Cl.
CPC .................. *G02F 1/134309* (2013.01); *G02F 2001/134345* (2013.01); *G02F 2001/134372* (2013.01); *G02F 2201/123* (2013.01); *H01L 29/78633* (2013.01)

(56) References Cited

U.S. PATENT DOCUMENTS

| | | |
|---|---|---|
| 7,795,616 B2 | 9/2010 | Yamazaki et al. |
| 7,960,735 B2 | 6/2011 | Jung et al. |
| 8,724,066 B2 | 5/2014 | Kim et al. |
| 9,280,026 B2 * | 3/2016 | Chang ............... H01L 29/78669 |
| 2018/0004055 A1 | 1/2018 | Jang et al. |

* cited by examiner

DISPLAY DEVICE INCLUDING A DATA LINE HAVING A DOUBLE LINE STRUCTURE

CROSS-REFERENCE TO RELATED APPLICATION

This application is a Continuation of Co-Pending U.S. patent application Ser. No. 15/472,796, filed on Mar. 29, 2017, which claims priority under 35 U.S.C. § 119 to Korean Patent Application No. 10-2016-0038496 filed on Mar. 30, 2016 in the Korean Intellectual Property Office, the disclosures of which are incorporated by reference herein in their entirety.

TECHNICAL FIELD

Exemplary embodiments of the present invention relate to a display device, and more particularly to a display device including a data line having a double line structure.

DISCUSSION OF RELATED ART

Liquid crystal display ("LCD") devices are a type of flat panel display ("FPD") device. An LCD device includes two substrates. The two substrates each include electrodes formed thereon. The LCD device also includes a liquid crystal layer. The liquid crystal layer is disposed between the two substrates. Upon applying a voltage to the electrodes, liquid crystal molecules of the liquid crystal layer are rearranged such that an amount of transmitted light is controlled in the LCD device.

The LCD device transmits a signal to a thin film transistor ("TFT") of each pixel by using a data line and a gate line. The data line is formed in an area overlapping the gate line. The data line is also formed in a vicinity of the TFT. Since an overlapping areas between the data line and the gate line and the vicinity of the TFT are areas in which components of the LCD device are concentrated, a relatively high occurrence of disconnection defects of the data line may occur in these areas. Furthermore, when a disconnection of the data line occurs, an additional repair scheme may be needed to repair the LCD device.

SUMMARY

One or more exemplary embodiments of the present invention provide a display device, and more particularly a display device that may relatively easily repair disconnection defects of a data line.

According to an exemplary embodiment of the present invention, a display device includes a substrate, a gate line, a data line, a plurality of thin film transistors, a first pixel electrode, and a second pixel electrode. The gate line is disposed on the substrate. The data line is disposed on the substrate. The data line includes a first branch line and a second branch line. The first branch line and the second branch line form a closed loop. The plurality of thin film transistors is connected to the data line. The first pixel electrode is connected to at least one of the thin film transistors. The second pixel electrode is connected to at least another one of the plurality of thin film transistors. The first pixel electrode and the second pixel electrode are arranged in a substantially diagonal direction with respect to each another. The first branch line is connected to a source electrode of said at least one of the plurality of thin film transistors. The second branch line is connected to a source electrode of said at least another one of the plurality of thin film transistors.

The first branch line and the second branch line may each overlap the gate line.

Each of the first pixel electrode and the second pixel electrode may include a first sub-pixel electrode and a second sub-pixel electrode.

The first branch line may be connected to the first sub-pixel electrode of the first pixel electrode. The second branch line may be connected to the second sub-pixel electrode of the second pixel electrode.

The first branch line may be connected to the second sub-pixel electrode of the first pixel electrode. The second branch line may be connected to the first sub-pixel electrode of the second pixel electrode.

The gate line may include a first gate line and a second gate line. The first gate line may be connected to the first sub-pixel electrode. The second gate line may be connected to the second sub-pixel electrode.

The first branch line may be connected to the first gate line. The second branch line may be connected to the second gate line.

The first branch line may overlap a portion of a gate electrode protruding from the first gate line. The first branch line may overlap a portion of the second gate line.

The second branch line may overlap a portion of a gate electrode protruding from the second gate line. The second branch line may overlap a portion of the first gate line.

The first branch line may be connected to the second gate line. The second branch line may be connected to the first gate line.

The first branch line may overlap a portion of a gate electrode protruding from the second gate line. The first branch line may overlap a portion of the first gate line.

The second branch line may overlap a portion of a gate electrode protruding from the first gate line. The second may overlap a portion of the second gate line.

The data line may be disposed between the first pixel electrode and the second pixel electrode.

The first branch line may have a first groove having a semicircular shape. The second branch line may have a second groove having a semicircular shape.

The first groove and the second groove may be recessed in directions opposite to each other.

BRIEF DESCRIPTION OF THE DRAWINGS

These and/or other aspects of the will be more apparent and more readily appreciated from the following detailed description of the exemplary embodiments, taken in conjunction with the accompanying drawings, in which.

DETAILED DESCRIPTION OF THE EMBODIMENTS

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that when an element is referred to as being "connected" to another element, the element is "directly connected" to the other element, or "electrically connected" to the other element with one or more intervening elements interposed therebetween.

It will be understood that when a component, such as a layer, film a region, or a plate is referred to as being "on" another component, the component can be directly on the other component or intervening components may be present.

It will be understood that, although the terms "first," "second," "third," and the like may be used herein to describe various elements, these elements should not be limited by these terms.

Hereinafter a display device according to an exemplary embodiment of the present invention will be described in detail with reference to FIGS. 1 to 6. According to an exemplary embodiment of the present invention, the display device may be a liquid crystal display ("LCD") device.

Figure 1:
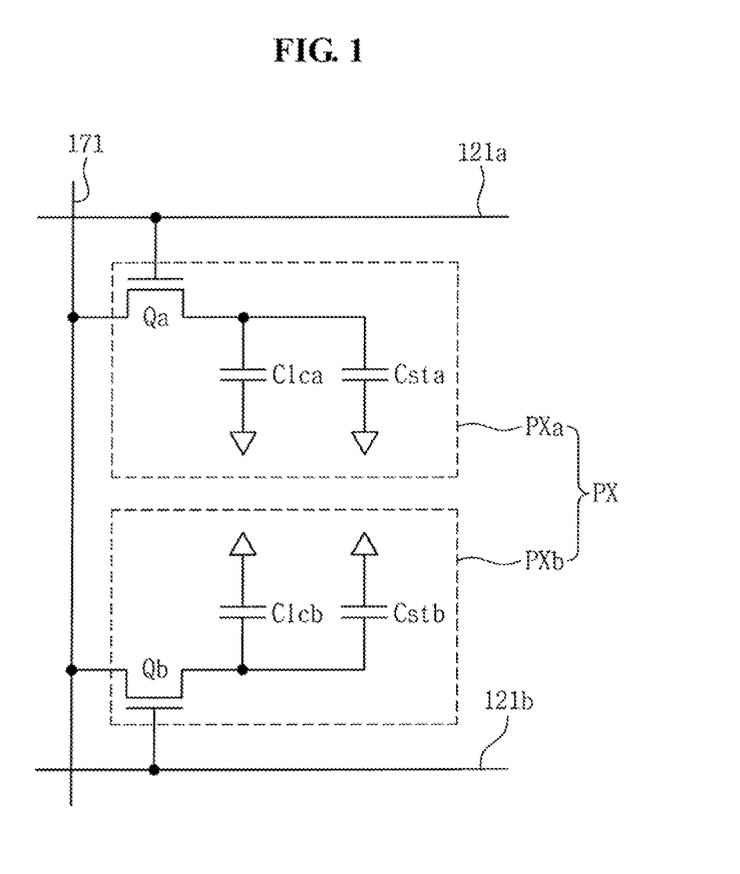
FIG. 1 is an equivalent circuit diagram illustrating a pixel of a display device according to an exemplary embodiment of the present invention.

FIG. 1 is an equivalent circuit diagram illustrating a pixel of a display device according to an exemplary embodiment of the present invention.

Referring to FIG. 1, the display device may include a signal line. The signal line may include a data line 171, a first gate line 121a, and a second gate line 121b. The display device may also include a pixel PX. The pixel PX may be connected to each of the data line, the first gate line 121a, and the second gate line 121b. The pixel PX may include a first sub-pixel PXa and a second sub-pixel PXb. The first sub-pixel PXa may be connected to each of the first gate line 121a and the data line 171. The second sub-pixel PXb may be connected to each of the second gate line 121b and the data line 171.

The first sub-pixel PXa may include a first thin film transistor ("TFT") Qa. The first TFT Qa may include a control terminal, an input terminal, and an output terminal. The control terminal may be connected to the first gate line 121a. The input terminal may be connected to the data line 171. The output terminal may be connected to each of a first liquid crystal capacitor Clca and a first storage capacitor Csta of the first sub-pixel PXa.

The second sub-pixel PXb may include a second TFT Qb. The second TFT Qb may include a control terminal, an input terminal, and an output terminal. The control terminal may be connected to the second gate line 121b. The input terminal may be connected to the data line 171. The output terminal may be connected to each of a second liquid crystal capacitor Clcb and a second storage capacitor Cstb of the second sub-pixel PXb.

The first liquid crystal capacitor Clca and the second liquid crystal capacitor Clcb may each receive different data voltages at different times. The data voltages Vd may be for an input image signal IDAT. The input image signal IDAT may be applied to the first and second liquid crystal capacitors Clca and Clcb from the data line 171 through the first and second TFTs Qa and Qb connected to the first and second gate lines 121a and 121b, respectively.

The display device according to an exemplary embodiment of the present invention having a circuit structure as illustrated in FIG. 1 will be described in more detail below with reference to FIGS. 2 to 6.

Figure 2:
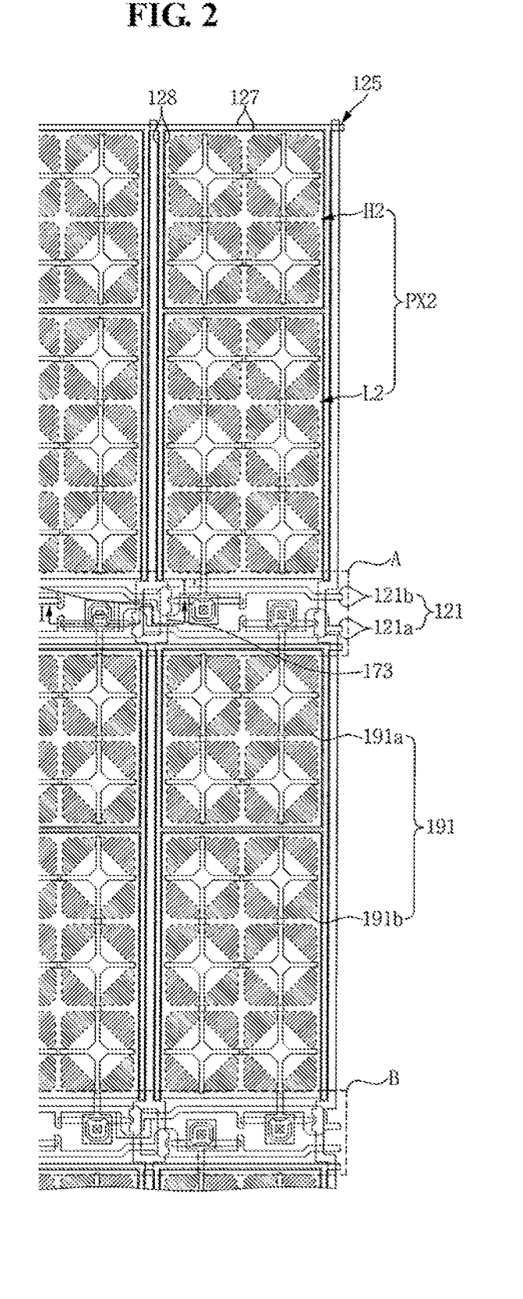
FIG. 2 is a plan view illustrating a plurality of pixels of a display device according to an exemplary embodiment of the present invention.
Figure 3:
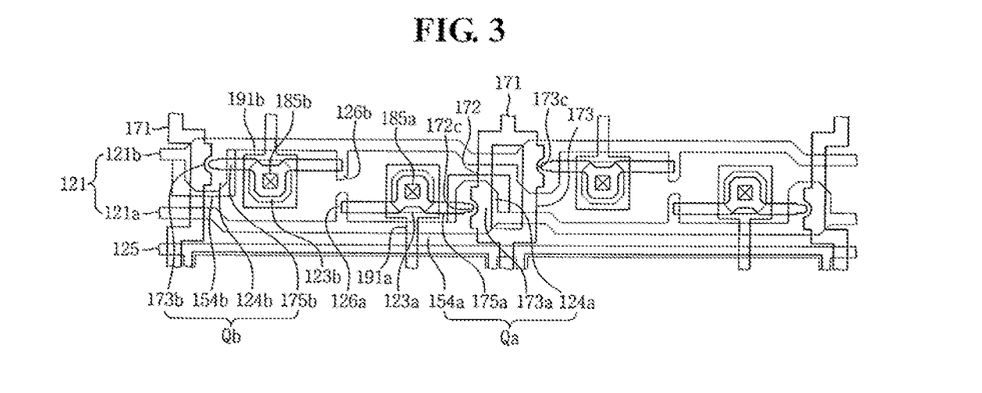
FIG. 3 is an enlarged plan view illustrating an area A of FIG. 2 according to an exemplary embodiment of the present invention.
Figure 4:
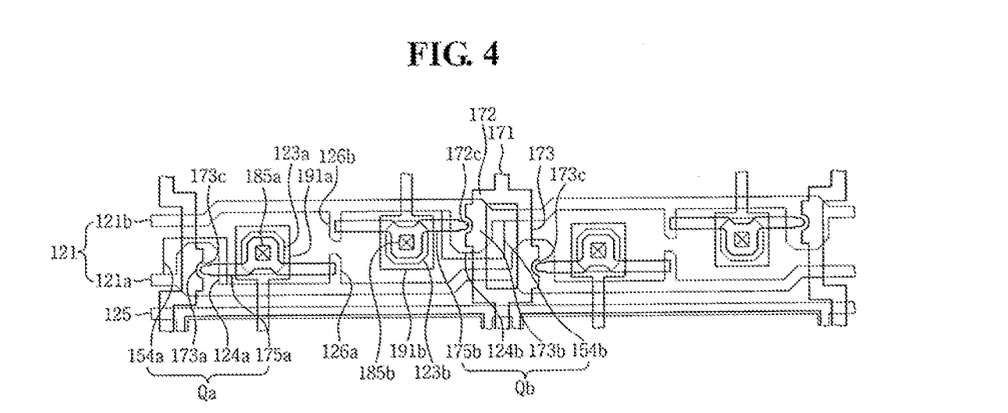
FIG. 4 is an enlarged plan view illustrating an area B of FIG. 2 according to an exemplary embodiment of the present invention.
Figure 5:
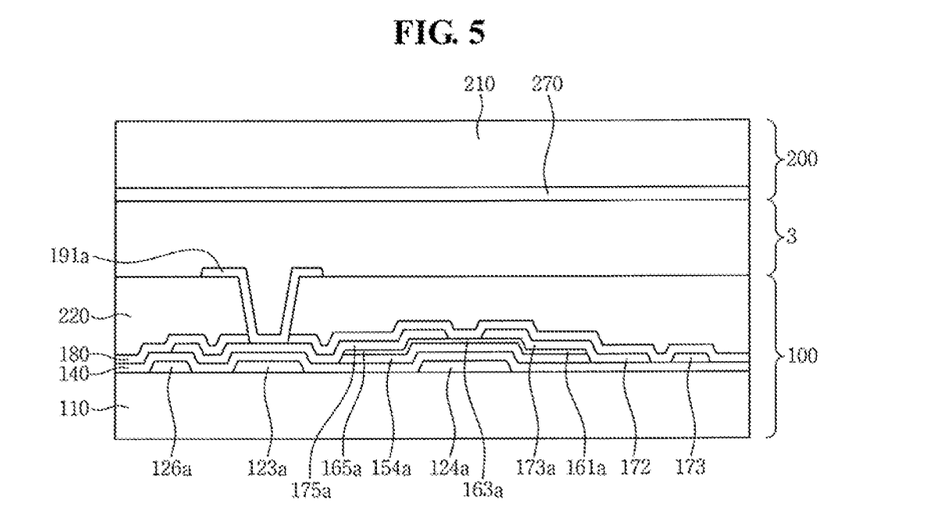
FIG. 5 is a cross-sectional view taken along a line I-I' of FIG. 2 according to an exemplary embodiment of the present invention.
Figure 6:
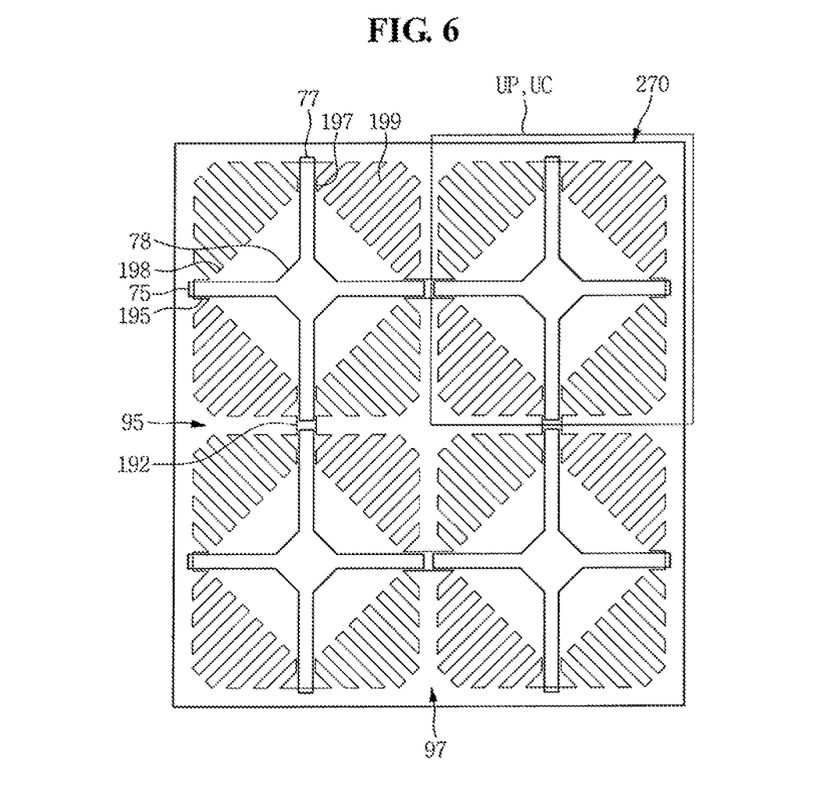
FIG. 6 is a plan view illustrating a pixel electrode and an upper panel electrode of a display device according to an exemplary embodiment of the present invention.

FIG. 2 is a plan view illustrating a plurality of pixels of a display device according to an exemplary embodiment of the present invention. FIG. 3 is an enlarged plan view illustrating an area A of FIG. 2 according to an exemplary embodiment of the present invention. FIG. 4 is an enlarged plan view illustrating an area B of FIG. 2 according to an exemplary embodiment of the present invention. FIG. 5 is a cross-sectional view taken along a line I-I' of FIG. 2 according to an exemplary embodiment of the present invention. FIG. 6 is a plan view illustrating a pixel electrode and an upper panel electrode of a display device according to an exemplary embodiment of the present invention.

Referring to FIG. 2, the display device may include a plurality of pixels. The plurality of pixels may include a first pixel PX1 and a second pixel PX2. The first pixel PX1 and the second pixel PX2 may each be arranged in a matrix form. Each of the first pixel PX1 and the second pixel PX2 may include two sub-pixels H1, H2, L1 and L2. For example, the first pixel PX1 may include the sub-pixels L1 and H1. The second pixel PX2 may include the sub-pixels H2 and L2. The first pixel PX1 and the second pixel PX2 will each be described in more detail below.

Referring to FIGS. 2 to 4, the first pixel PX1 and the second pixel PX2 may each be arranged in a substantially diagonal direction with respect to each other. The first pixel PX1 may include a first sub-pixel H1 and a second sub pixel L1. The second pixel PX2 may include a first sub-pixel H2 and a second sub-pixel L2. Each of the first pixel PX1 and the second pixel PX2 may include the first and second TFTs Qa and Qb. The first and second TFTs Qa and Qb may each be disposed at an upper end and a lower end of each of the first pixel PX1 and the second pixel PX2. The first sub-pixels H1 and H2 may be connected to the first TFT Qa at the upper end of each of the first pixel PX1 and the second pixel PX2, respectively. The second sub-pixels L1 and L2 may be connected to the second TFT Qb at the lower end of the first pixel PX1 and the second pixel PX2, respectively.

Referring to FIG. 5, the display device may include a lower display panel 100 and an upper display panel 200. The lower display panel 100 and the upper display panel 200 may be disposed to face each other. The display panel may also include a liquid crystal layer 3. The liquid crystal layer 3 may be disposed between the first display panel 100 and the second display panel 200.

The lower display panel 100 may include a plurality of gate conductors. Referring to FIGS. 3 to 5, the gate conductors may include a gate line 121, a storage electrode line 125, a first light shielding pattern 123a, and a second light shielding pattern 123b. The gate line 121, the storage electrode line 125, the first light shielding pattern 123a, and the second light shielding patter 123b may each be disposed on an insulating substrate 110. The gate line 121 may extend in a horizontal direction. The gate line 121 may transmit a gate signal.

The gate line 121 may include the first gate line 121a and the second gate line 121b. Referring to FIG. 2, the first gate line 121a may be connected to each of the first sub-pixels H1 and H2. The second gate line 121b may be connected to each of the second sub-pixels L1 and L2.

Referring to FIGS. 3 and 4, the first gate line 121a may include the first gate electrode 124a. The second gate line 121b may include the second gate electrode 124b. The first gate line 121a may include a first protrusion 126a. The second gate line 121b may include a second protrusion 126b. The first protrusion 126a and the second protrusion 126b may each be configured to maintain a substantially constant storage capacitance between gate electrodes 124a and 124b and drain electrodes 175a and 175b, respectively. The gate electrodes 124a and 124b and the drain electrodes 175a and 175b will be described in more detail below.

Referring to FIG. 2, the storage electrode line 125 may extend in a horizontal direction. The storage electrode line 125 may transmit a predetermined voltage, for example, a common voltage. The storage electrode line 125 may include a storage extension portion, a pair of vertical portions 128, and a horizontal portion 127. The pair of vertical portions 128 may extend upwardly and substantially perpendicularly to the gate line 121. The horizontal portion 127 may connect the pair of vertical portions 128 to each other; however, a structure of the storage electrode line 125 is not limited thereto.

Referring to FIGS. 3 to 5, the first light shielding pattern 123a may be disposed below a first contact hole 185a. The second light shielding pattern 123b may be disposed below a second contact hole 185b. The first and second light shielding patterns 123a and 123b respectively disposed below the first and second contact holes 185a and 185b may be configured to block light.

A gate insulating layer 140 may be disposed on the gate conductor. Each of a first semiconductor 154a and a second semiconductor 154b may be disposed on the gate insulating layer 140. The first semiconductor 154a and the second semiconductor 154b may each extend in a substantially vertical direction. The first semiconductor 154a may extend toward the first gate electrode 124a. The second semiconductor 154b may extend toward the second gate electrode 124b.

Ohmic contact members 161a, 163a, and 165a may be disposed on each of the first semiconductor 154a and the second semiconductor 154b.

A data conductor may be disposed on the ohmic contact members 161a, 163a, and 165a. The data conductor may include the data line 171, a first drain electrode 175a, and a second drain electrode 175b.

The data line 171 may include a first source electrode 173a and a second source electrode 173b. The first source electrode 173a may partially overlap the first gate electrode 124a. The second source electrode 173b may partially overlap the second gate electrode 124b.

The data line 171 may include a first branch line 172 and a second branch line 173. The first branch line 172 and the second branch line 173 may form a closed loop with each other. The first branch line 172 and the second branch line 173 may each be connected in a substantially parallel structure. The first branch line 172 and the second branch line 173 may each overlap the gate line 121.

The first branch line 172 may be connected to a source electrode of a TFT disposed on the first pixel PX1. The second branch line 173 may be connected to a source electrode of a TFT disposed on the second pixel PX2.

For example, referring to FIGS. 3 and 4, positions of the first TFT Qa and the second TFT Qb may be interchanged with each other for each row. As illustrated in FIG. 3, the first TFT Qa and the second TFT Qb may be disposed on a right side and a left side of the display device, respectively. However, as illustrated in FIG. 4, the first TFT Qa and the second TFT Qb may be disposed on the left side and the right side of the display device, respectively. Each of the first and second pixels PX1 and PX2 may each operate with the first and second gate lines 121a and 121b, respectively, and the data line 171.

With the above-described structure, a connection structure of the first branch line 172 and the second branch line 173 will be described in more detail below with reference to FIG. 3. Referring to FIG. 3, the first pixel PX1 and the second pixel PX2 may each be arranged in a substantially diagonal direction. The second pixel PX2 may be disposed above the first pixel PX1 at an upper position. The first branch line 172 may be connected to the first sub-pixel H1 of the first pixel PX1. The second branch line 173 may be connected to the second sub-pixel L2 of the second pixel PX2. The first branch line 172 may be connected to the first gate line 121a. The second branch line 173 may be connected to the second gate line 121b. The first branch line 172 may overlap a portion of the first gate electrode 124a protruding from the first gate line 121a. The first branch line 172 may also overlap a portion of the second gate line 121b. The second branch line 173 may overlap a portion of the second gate electrode 124b protruding from the second gate line 121b. The second branch line 173 may also overlap a portion of the first gate line 121a.

The connection structure of the first branch line 172 and the second branch line 173 will be described in more detail below with reference to FIG. 4. Referring to FIG. 4, the first pixel PX1 and the second pixel PX2 may each be arranged in a substantially diagonal direction. The second pixel PX2 may be disposed at a lower position than the first pixel PX1. Although as illustrated in FIG. 2, the second pixel PX2 may be disposed at an upper position, the second pixel PX2 may be disposed at a lower position, which will be described further with respect to FIG. 4. The first branch line 172 may be connected to the second sub-pixel L1 of the first pixel PX1. The second branch line 173 may be connected to the first sub-pixel H2 of the second pixel PX2. The first branch line 172 may be connected to the second gate line 121b. The second branch line 173 may be connected to the first gate line 121a. The first branch line 172 may overlap a portion of the second gate electrode 124b protruding from the second gate line 121b. The first branch line 172 may also overlap a portion of the first gate line 121a. The second branch line 173 may overlap a portion of the first gate electrode 124a protruding from the first gate line 121a. The second branch line 173 may also overlap a portion of the second gate line 121b.

When the data line 171 includes each of the first branch line 172 and the second branch line 173 forming a closed loop in an area in which the data line 171 overlaps the gate line 121 and the TFT, a data signal may be transmitted to another of the first branch line 172 and the second branch line 173.

According to an exemplary embodiment of the present invention, the first branch line 172 may have a first groove 172c. The first groove 172c may have a semicircular shape. The first source electrode 173a may correspond to a peripheral portion of the first groove 172c. The second branch line 173 may have a second groove 173c. The second groove 173c may have a semicircular shape. The second source electrode 173b may correspond to a peripheral portion of the second groove 173c. The first groove 174c and the second groove 173c may each be recessed in directions opposite to each other when viewed in a vertical cross-section.

The first drain electrode 175a and the second drain electrode 175b may each have a rod shape. End portions of each of the first drain electrode 175a and the second drain electrode 175b may have a rod shape. End portions of each of the first drain electrode 175a and the second drain electrode 175b may be partially enclosed by the first source electrode 173a and the second source electrode 173b, respectively.

The first and second gate electrodes 124a and 124b, the first and second source electrodes 173a and 173b, the first and second drain electrodes 175a and 175b, and the first and second semiconductors 154a and 154b, may together define the first and second TFTs Qa and Qb, respectively.

A protective layer 180 may be disposed on the data conductor. Exposed portions of the first and second semiconductors 154a and 154b, a color filter, a light shielding member 220 may be disposed on the protective layer 180. The light shielding member 220 may be disposed on each of the first TFT Qa and the second TFT Qb. Alternatively, at least one of the color filter and the light shielding member 220 may be disposed on the upper display panel 200.

An upper protective layer may be disposed on each of the color filter and the light shielding member 220.

A plurality of contact boles 185a and 185b may expose the first drain electrode 175a and the second drain electrode 175b, respectively. The contact holes 185a and 185b may be defined in each of the upper protective layer and the light shielding member 220.

A pixel electrode 191 may be disposed on the upper protective layer. The pixel electrode 191 may include a first sub-pixel electrode 191a and a second sub-pixel electrode 191b.

When an area of the second sub-pixel electrode 191b is different from an area of the first sub-pixel electrode 191a, the first sub-pixel electrode 191a may include four lower panel unit electrodes UP and the second sub-pixel electrode 191b may include six or eight lower panel unit electrodes UP as illustrated in FIG. 2. The area of the second sub pixel electrode 191b may be different from the area of the first sub-pixel electrode 191a to increase a side visibility of the display device. Referring to FIG. 2, the first sub-pixel electrode 191a may include four lower panel unit electrodes UP. The second sub-pixel electrode 191b may include includes six lower panel unit electrodes UP. However, exemplary embodiments of the present invention are not limited thereto.

The first sub-pixel electrode 191a may be configured to receive a data voltage from the first drain electrode 175a through the first contact hole 185a. The second sub-pixel electrode 191b may be configured to receive a data voltage from the second drain electrode 175a through the second contact hole 185b.

The upper display panel 200 will be described in more detail below. The upper display panel 200 may include an upper panel electrode 270 and an insulating substrate 210. The upper panel electrode 270 may be disposed on the insulating substrate 210. The upper panel electrode 270 is disposed on each of the first sub-pixels H1 and H2 and the second sub-pixels L1 and L2.

When areas of the second sub-pixels L1 and L2 are different from areas of the first sub-pixels H1 and H2, similar to the pixel electrode 191, the upper panel electrode 270 of the first sub-pixels H1 and H2 may include four upper panel unit electrodes UC and the upper panel electrode 270 of the second sub-pixels L1 and L2 may include six or eight upper panel unit electrodes UC. However, exemplary embodiments of the present invention are not limited thereto.

The first liquid crystal capacity Clca may include the first sub-pixel electrode 191a, the upper panel electrode 270, and the liquid crystal layer 3. The liquid crystal layer 3 may be disposed between the first sub-pixel electrode 191a and the upper panel electrode 270. The second liquid crystal capacitor Clcb may include the second sub-pixel electrode 191b, the upper panel electrode 270, and the liquid crystal layer 3. The liquid crystal layer 3 may be disposed between the second sub-pixel electrode 191b and the upper panel electrode 270. Accordingly, a voltage applied to the first liquid crystal capacity Clca and/or the second liquid crystal capacitor Clcb may be maintained when the first and second TFTs Qa and Qb are turned off. The first and second sub-pixel electrodes 191a and 191b may each overlap the storage electrode line 125. The first sub-pixel electrode 191a overlapping the storage electrode line 125 may form the first storage capacitor Csta. The second sub-pixel electrode 191b overlapping the storage electrode line 125 may form the second storage capacitor Cstb.

The display device according to one or more exemplary embodiments of the present invention may be applied to any exemplary embodiments of the present invention in which the pixel electrode 191 for each pixel PX may include a plurality of lower panel unit electrodes UP. Additionally, the upper panel electrode 270 for each pixel PX may include a plurality of upper panel unit electrodes UC. The number of the lower panel unit electrodes UP and/or the number of the upper panel unit electrodes UC included in each pixel PX may vary, for example, in consideration of a liquid crystal control force based on the structure and area of the pixel PX. Four lower panel unit electrodes UP connected to each other and four upper panel unit electrodes UC connected to one another are described in detail herein; however, exemplary embodiments of the present invention are not limited thereto.

Referring to FIG. 6, the plurality of lower panel unit electrodes UP may be connected to each other, for example, through a connection portion 192. The connection portion 192 may be disposed on an extension line of cruciform stem portions 195 and 197 of the lower panel unit electrode UP. A space among lower panel unit electrodes UP that are adjacent to one another in a column direction, for example, in a vertical direction, may form a horizontal gap 95. A space among lower panel unit electrodes UP that are adjacent to one another in a row direction, for example, in a horizontal direction, may form a vertical gap 97.

The plurality of upper panel unit electrodes UC may be connected to each other. Cruciform openings 75 and 77 of the upper panel unit electrodes UC that are adjacent to one another in a row direction or a column direction may be connected to each other. In such an exemplary embodiment of the present invention, in order to prevent the upper panel unit electrodes UC of one upper panel electrode 270 from being separated, end portions of the cruciform openings 75 and 77 adjacent to edge sides of the upper panel electrode 270 may be spaced apart from the edge surfaces of the upper panel electrode 270 to form a connection portion. Four sub-areas separated by the cruciform opening 75 and 77 in each of the upper panel unit electrodes UC may be connected to each other through the connection portion 192.

Referring to FIG. 6, the pixel electrode 191 may include a central pattern 198. The central pattern 198 may be disposed at a central portion of the cruciform stem portions 195 and 197 of each of the lower panel unit electrodes UP. For example, when the central pattern 198 has a lozenge shape, each edge side may form an oblique angle with respect to an extension direction of the cruciform stem portion 195 and 197. An edge surface of the central pattern 198 and an extension direction of a fine branch portion 199 may be substantially perpendicular to one another.

When the central pattern 198 including a plurality of sides is formed at the central portion of the cruciform stem portion 195 and 197 in each of the lower panel unit electrodes UP, the liquid crystal control force may be increased as a fringe field generated by the edge side of the central pattern 198 affects the vicinity of the horizontal gap 95 or the vertical gap 97. Accordingly, after an external pressure is removed, a stain caused by texture may be less likely to occur or may be removed with relative ease.

The upper panel electrode 270 may include a central opening 78. The central opening 78 may be disposed at a central portion of the cruciform openings 75 and 77 of each of the upper panel unit electrodes UC. For example, when the central opening 78 has a lozenge shape, each edge surface may form an oblique angle with respect to the extension direction of the cruciform stem portions 195 and 197. An edge surface of the central opening 78 and an extension direction of a fine branch portion 199 may be substantially perpendicular to one another.

When the upper panel electrode 270 has the central opening 78, the liquid crystal control force may be increased as a fringe field generated by the edge surface of the central opening 78 alters the vicinity of the horizontal gap 95 or the vicinity of the vertical gap 97. Accordingly, after an external pressure is removed, a stain caused by texture may be less likely to occur or may be removed with relative ease.

In one or more exemplary embodiments of the present invention, the data line may be formed into a double line. Thus, a disconnection ratio of the data line may be decreased.

Various exemplary embodiments of the present invention have been described herein for purposes of illustration, and that various modifications may be made without departing from the scope and spirit of the present invention. Accordingly, the various exemplary embodiments of the present invention disclosed herein are not intended to be limiting. Various features of the above described and other exemplary embodiments of the present invention can be mixed and matched in any manner, to produce further exemplary embodiments consistent with the present invention.

What is claimed is:

1. A display device comprising:
   a substrate;
   a gate line disposed on the substrate;
   a data line disposed on the substrate, the data line comprising a first branch line and a second branch line;
   a plurality of thin film transistors connected to the data line;
   a first pixel electrode connected to a first thin film transistor of the plurality of thin film transistors; and
   a second pixel electrode connected to a second thin film transistor of the plurality of thin film transistors,
   wherein the first pixel electrode and the second pixel electrode are arranged in a substantially diagonal direction with respect to each another,
   wherein the first branch line comprises a first portion branched from the data line and a second portion branched from the data line and spaced apart from the first portion, the first portion and the second portion being connected to a first source electrode of the first thin film transistor, and
   wherein the second branch line comprises a third portion branched from the data line and a fourth portion branched from the data line and spaced apart from the third portion, the third portion and the fourth portion being connected to a second source electrode of the second thin film transistor.

2. The display device of claim 1, wherein the first branch line and the second branch line form a closed loop.

3. The display device of claim 1, wherein the first source electrode and the second source electrode are arranged in a substantially diagonal direction with respect to each another between the first pixel electrode and the second pixel electrode.

4. The display device of claim 1, wherein the first branch line and the second branch line each overlap the gate line.

5. The display device of claim 1, wherein each of the first pixel electrode and the second pixel electrode comprises a first sub-pixel electrode and a second sub-pixel electrode.

6. The display device of claim 5, wherein the first branch line is connected to the first sub-pixel electrode of the first pixel electrode, and the second branch line is connected to the second sub-pixel electrode of the second pixel electrode.

7. The display device of claim 5, wherein the first branch line is connected to the second sub-pixel electrode of the first pixel electrode, and the second branch line is connected to the first sub-pixel electrode of the second pixel electrode.

8. The display device of claim 5, wherein the gate line comprises a first gate line connected to the first sub-pixel electrode and a second gate line connected to the second sub-pixel electrode.

9. The display device of claim 8, wherein the first thin film transistor and the second thin film transistor are disposed between the first gate line and the second gate line.

10. The display device of claim 8, wherein the first branch line is connected to the first gate line, and the second branch line is connected to the second gate line.

11. The display device of claim 10, wherein the first branch line overlaps each of a portion of a gate electrode protruding from the first gate line and a portion of the second gate line.

12. The display device of claim 10, wherein the second branch line overlaps each of a portion of a gate electrode protruding from the second gate line and a portion of the first gate line.

13. The display device of claim 8, wherein the first branch line is connected to the second gate line, and the second branch line is connected to the first gate line.

14. The display device of claim 13, wherein the first branch line overlaps each of a portion of a gate electrode protruding from the second gate line and a portion of the first gate line.

15. The display device of claim 13, wherein the second branch line overlaps each of a portion of a gate electrode protruding from the first gate fine and a portion of the second gate line.

16. The display device of claim 1, wherein the data line is disposed between the first pixel electrode and the second pixel electrode.

17. The display device of claim 1, wherein the first source electrode has a first groove having a semicircular shape, and the second source electrode has a second groove having a semicircular shape.

18. The display device of claim 17, wherein the first groove and the second groove are recessed in directions opposite to each other.

* * * * *